US012567452B2

(12) United States Patent
Bedeschi et al.

(10) Patent No.: US 12,567,452 B2
(45) Date of Patent: Mar. 3, 2026

(54) WORD LINE CHARGE INTEGRATION

(71) Applicant: Micron Technology, Inc., Boise, ID (US)

(72) Inventors: Ferdinando Bedeschi, Biassono (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 18/528,451

(22) Filed: Dec. 4, 2023

(65) Prior Publication Data

US 2024/0212736 A1 Jun. 27, 2024

Related U.S. Application Data

(60) Provisional application No. 63/476,794, filed on Dec. 22, 2022.

(51) Int. Cl.
| | |
|---|---|
| *G11C 11/22* | (2006.01) |
| *G11C 11/408* | (2006.01) |
| *G11C 11/4091* | (2006.01) |

(52) U.S. Cl.
CPC ...... *G11C 11/2257* (2013.01); *G11C 11/2273* (2013.01); *G11C 11/4085* (2013.01); *G11C 11/4091* (2013.01)

(58) Field of Classification Search
CPC ............ G11C 11/2257; G11C 11/2273; G11C 11/4085; G11C 11/4091; G11C 11/5642; G11C 16/0483; G11C 16/08; G11C 16/26; G11C 16/32
See application file for complete search history.

(56) References Cited

U.S. PATENT DOCUMENTS

| | | | |
|---|---|---|---|
| 2007/0091664 A1* | 4/2007 | Chow | ................. G11C 29/026 |
| | | | 365/145 |
| 2017/0263304 A1 | 9/2017 | Vimercati | |
| 2019/0164591 A1 | 5/2019 | Takahashi et al. | |
| 2019/0378561 A1 | 12/2019 | Kubo et al. | |
| 2020/0273516 A1 | 8/2020 | Di Vincenzo | |
| 2021/0375354 A1* | 12/2021 | Partsch | .............. G11C 11/4076 |
| 2022/0254397 A1 | 8/2022 | He et al. | |

OTHER PUBLICATIONS

"International Search Report and Written Opinion of the International Searching Authority," issued in connection with Int'l Appl. No. PCT/US2023/82555, dated Apr. 5, 2024 (9 pages).

* cited by examiner

*Primary Examiner* — Sultana Begum
(74) *Attorney, Agent, or Firm* — Holland & Hart LLP

(57) ABSTRACT

Methods, systems, and devices for word line charge integration are described. In some examples, a memory device may include a plurality of memory cells that are coupled with a word line and respective digit lines. During a read operation, the word line may be activated (e.g., driven to a voltage) and a subset of the respective digit lines may be activated (e.g., driven to a voltage) to begin integrating charges of each of the memory cells. Before each digit line is activated, the word line may be deactivated and the remaining digit lines may be activated (e.g., driven to a voltage) to begin integrating charges of the remaining memory cells that are coupled with the word line. After each of the digit lines are selected, respective sense components may be activated to sense the charges associated with the memory cells.

20 Claims, 5 Drawing Sheets

300-a 300-b

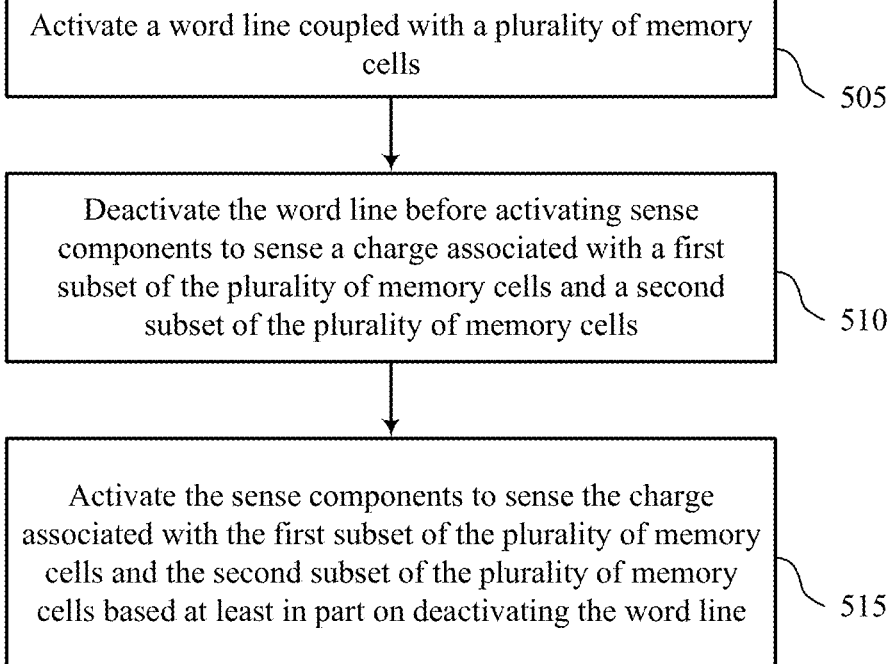

Activate a word line coupled with a plurality of memory cells
505

Deactivate the word line before activating sense components to sense a charge associated with a first subset of the plurality of memory cells and a second subset of the plurality of memory cells
510

Activate the sense components to sense the charge associated with the first subset of the plurality of memory cells and the second subset of the plurality of memory cells based at least in part on deactivating the word line
515

WORD LINE CHARGE INTEGRATION

CROSS REFERENCE

The present Application for Patent claims the benefit of U.S. Provisional Patent Application No. 63/476,794 by BEDESCHI et al., entitled "WORD LINE CHARGE INTE-GRATION," filed Dec. 22, 2022, assigned to the assignee hereof, and expressly incorporated by reference herein.

TECHNICAL FIELD

The following relates to one or more systems for memory, including word line charge integration.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

BRIEF DESCRIPTION OF THE DRAWINGS

FIG. 5 illustrates a flowchart showing a method or methods that support word line charge integration in accordance with examples as disclosed herein.

DETAILED DESCRIPTION

A memory device may include memory cells that are coupled with access lines (e.g., word lines, digit lines, plate lines). For example, a memory device may be an example of ferroelectric random access memory (FeRAM) or dynamic random access memory (DRAM). The memory device may include a plurality of non-volatile memory cells (e.g., FeRAM) or volatile memory cells (e.g., DRAM) that are coupled with word lines and respective digit line. Moreover, some DRAM memory devices may utilize a feedback amplifier to bias the digit lines and integrate charges from respective memory cells on a capacitor (e.g., an amp-cap). However, the charge integration duration of memory cells may vary during access operations (e.g., read operations). Specifically, when a word line is activated (e.g., driven to a voltage) during a read operation, the memory cells at a first end of the word line (e.g., near the driver of the signal on the word line) may experience a longer charge integration duration than memory cells at a second end of the word line (e.g., away from the driver of the signal on the word line). The difference in charge integration durations may lead to different electrical responses of the memory cells, which may affect the memory device's overall performance and reliability. Accordingly, a memory device configured to mitigate the difference in charge integration durations of memory cells coupled with a word line is desirable.

A memory device configured to mitigate the difference in charge integration durations of memory cells coupled with a word line is described herein. In some examples, a memory device may include a plurality of FeRAM memory cells or DRAM memory cells that are coupled with a word line and respective digit lines. During a read operation, the word line may be activated (e.g., driven to a voltage) and a subset of the respective digit lines may be activated (e.g., driven to a voltage) to begin integrating charges of each of the memory cells. Before each digit line is activated, the word line may be deactivated and the remaining digit lines may be activated (e.g., driven to a voltage) to begin integrating charges of the remaining memory cells that are coupled with the word line. After each of the digit lines are selected, respective sense components may be activated to sense the charges associated with the memory cells. Accordingly, deactivating the word line before triggering the sense components may mitigate differences in the charge integration durations of the memory cells, which may improve the memory device's overall performance and reliability.

Figure 1:
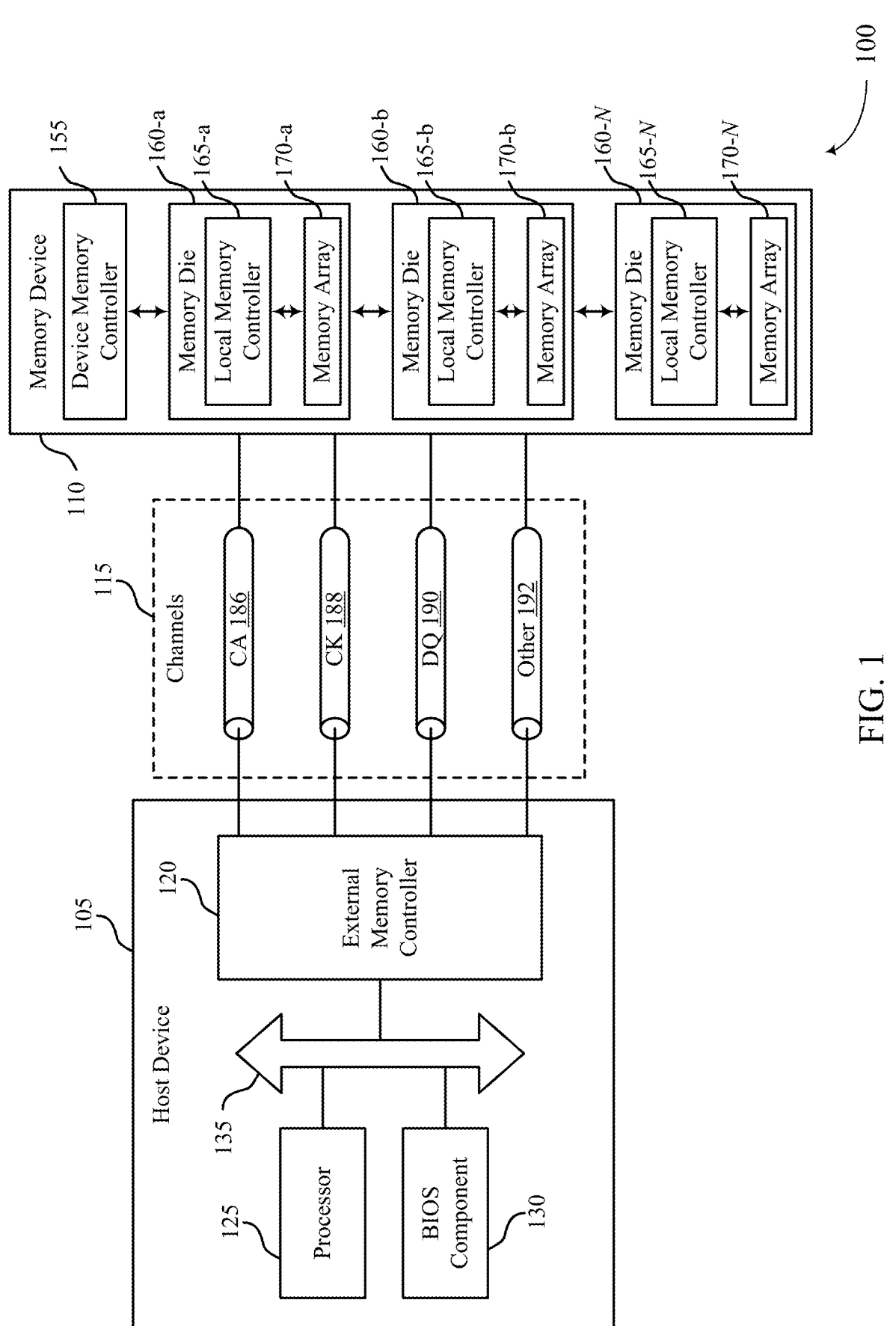
FIG. 1 illustrates an example of a system that supports word line charge integration in accordance with examples as disclosed herein.

Features of the disclosure are initially described in the context of systems and dies with reference to FIG. 1. Features of the disclosure are described in the context of timing diagrams and circuit diagrams with reference to FIGS. 2, 3A, and 3B. These and other features of the disclosure are further illustrated by and described with reference to an apparatus diagram and flowcharts that relate to word line charge integration as described with reference to FIGS. 4 and 5.

FIG. 1 illustrates an example of a system 100 that supports word line charge integration in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

As described herein, a memory array 170 may include one or more FeRAM memory cells or DRAM memory cells. Each type of memory cell may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cells may include a logic storage component, such as capacitor, and a switching component (e.g., a cell selection component). The capacitor may be an example of a dielectric capacitor or a ferroelectric capacitor. A node of the capacitor may be coupled with a voltage source, which may be the cell plate reference voltage, such as Vpl, or may be ground, such as Vss.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controllers 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105 or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may include a plurality of FeRAM memory cells or DRAM memory cells that are coupled with a word line and respective digit lines. During a read operation, the word line may be activated (e.g., driven to a voltage) and a subset of the respective digit lines may be activated (e.g., driven to a voltage) to begin integrating charges of each of the memory cells. Before each digit line is activated, the word line may be deactivated and the remaining digit lines may be activated (e.g., driven to a voltage) to begin integrating charges of the remaining memory cells that are coupled with the word line. After each of the digit lines are selected, respective sense components may be activated to sense the charges associated with the memory cells. Accordingly, deactivating the word line before triggering the sense components (e.g., completing the read operation) may mitigate differences in the charge integration durations of the memory cells, which may improve the overall performance and reliability of the memory device 110.

Figure 2:
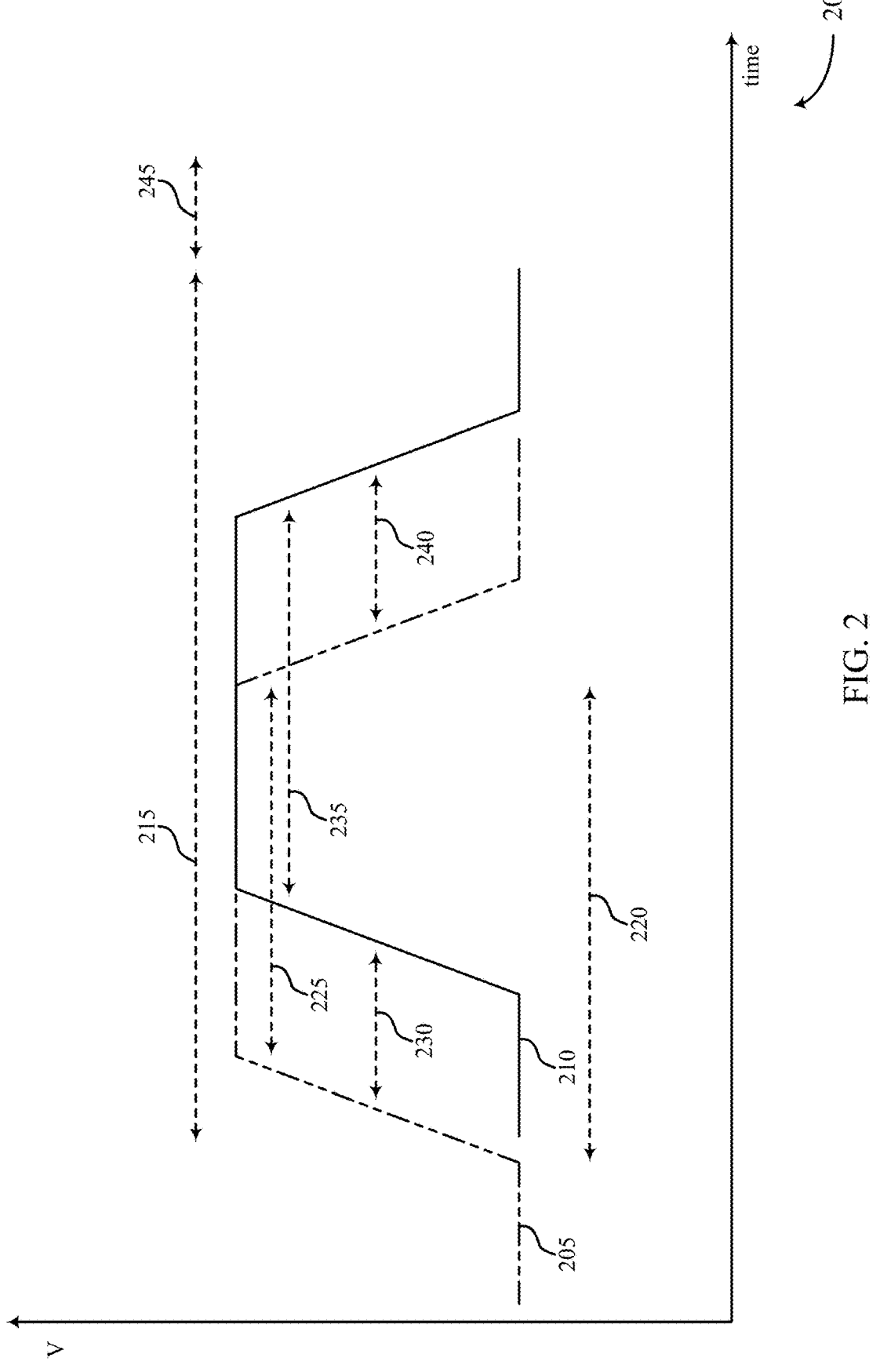
FIG. 2 illustrates an example of a timing diagram that supports word line charge integration in accordance with examples as disclosed herein.

FIG. 2 illustrates an example of a timing diagram 200 that supports word line charge integration in accordance with examples as disclosed herein. The timing diagram 200 may illustrate the voltage of a first node and a second node of a word line at various times. For example, the voltage 205 may represent a voltage of a first node at or near a first memory cell coupled with a word line and the voltage 210 may represent a voltage of a second node at or near a second memory cell coupled with the word line. As described herein, the first memory cell and the second memory cell may be located different ends of the word line (e.g., either closer to the driver of signal on the word line or farther from the driver). The voltage 205 shows the timing seen by a memory cell near the driver of the word line signal. The voltage 210 shows the timing seen by the memory cell away from the driver of the word line signal. As illustrated, there may be propagation delay for the word line signal experienced by memory cells farther away from the driver as compared with memory cells nearer the driver. The voltage 205 and the voltage 210 may illustrate the word line being deactivated before the end of a read operation (e.g., the firing of the sense components during duration 245), which may mitigate differences in the charge integration durations of the memory cells and may improve the overall performance and reliability of the associated memory device.

In some examples, the voltage 205 may represent a voltage of a first node of a word line that is at or near a first memory cell. The first memory cell may represent a memory cell that is relatively close in proximity to a voltage source coupled with the word line. For example, the first memory cell may be a first memory cell coupled with the word line and may be closer to the voltage source than any other memory cell coupled with the word line. Accordingly, when the word line is selected (e.g., driven to a voltage), the voltage 205 (e.g., the voltage of the first node) may increase relatively faster than the voltage of any other node (e.g., the second node) of the word line.

Additionally or alternatively, the voltage 210 may represent a voltage of a second node of the word line that is at or near a second memory cell. The second memory cell may represent a memory cell that is relatively far in proximity from the voltage source coupled with the word line. For example, the second memory cell may be a last memory cell coupled with the word line and may be farther from the voltage source than any other memory cell coupled with the word line. Accordingly, when the word line is selected (e.g., driven to a voltage), the voltage 210 (e.g., the voltage of the second node) may increase relatively slower than the voltage of any other node (e.g., the first node) of the word line.

Moreover, although the voltage 205 and the voltage 210 are shown as increasing and decreasing relatively linearly, the voltage 205 and the voltage 210 may increase or decrease in any manner. For example, the voltages may increase or decrease non-exponentially or in a generally sigmoid shape. Further, each of the voltages may remain constant (or relatively constant) for a duration after the word line is activated (e.g., driven to a voltage).

In some examples, a memory device (e.g., a memory device 110 as described with reference to FIG. 1) associated with the word line may receive a read command from a host device (e.g., a host device 105 as described with reference to FIG. 1). The read command may be associated with reading the memory cells coupled with the word line. Upon receiving the read command, a memory controller (e.g., a device memory controller 155 as described with reference to FIG. 1) or other component of the memory device may initiate a read operation by activating the word line. The read operation may occur during the duration 215 and the word line may be activated during the duration 220. As described herein, the word line may be activated by applying a voltage to the word line. In some examples, the voltage may be applied by activating a switch (or other component) coupled with the voltage source and the word line. Upon activating the word line, the voltage 205 may begin to increase.

After the voltage 205 increases, a charge associated with the first memory cell may be integrated. As used herein, "integration" or "charge integration" may refer to the process of providing a charge from a memory cell to a respective sense component. For example, the first memory cell may be integrated during the duration 225. Accordingly, during the duration 225 (e.g., a first duration), a digit line coupled with the first memory cell may be selected, and a charge associated with the first memory cell may be integrated to a respective sense component. In some cases, the charge associated with various memory cells may be integrated when the voltage of the word line reaches a threshold voltage level. Due to the length of the word line, different nodes of the word line may reach the threshold voltage level at different times.

In some examples, a delay 230) may exist between when the voltage 205 increases and when the voltage 210 increases. As described herein, the delay 230 may occur due to the length of the word line and propagation delays of the signal as the signal travels the length of the word line. After the voltage 210 increases, a charge associated with the second memory cell may be integrated. For example, the second memory cell may be integrated during the duration 235. Accordingly, during the duration 235, a digit line coupled with the second memory cell may be selected, and a charge associated with the second memory cell may be integrated to a respective sense component.

During the duration 235 (e.g., the first duration), the word line may be deactivated. As described herein, the word line may be deactivated by removing the voltage from the word line or by driving the word line to a different voltage (e.g., to ground). In some examples, the voltage may be removed by deactivating a switch (or other component) coupled with the voltage source and the word line. Upon deactivating the word line, the voltage 205 may begin to decrease.

By deactivating the word line before the read operation is complete (e.g., before the end of 215), the integration time of the first memory cell and the second memory cell may be the same or similar. That is, the duration 225 may be a same or a similar duration as the duration 235. Moreover, other memory cells coupled with the word line (e.g., memory cells located between the first memory cell and the second memory cell) may experience the same or similar integration times. Additionally or alternatively, a delay 240 may exist between when the voltage 205 decreases and when the voltage 210 decreases. The delay 230 and the delay 240 may, likewise, be the same or similar due to deactivating the word line before the read operation is complete.

After the read operation is complete (e.g., after the duration 215), the sense components associated with the word line may be activated to sense the respective charges. For example, the first memory cell may be coupled with a first sense component and the second memory cell may be coupled with a second sense component. The first sense component and the second sense component may be activated during a duration 245 to sense the charges associated with the first memory cell and the second memory cell, respectively. Other sense components (e.g., coupled with other memory cells of the word line) may be similarly activated during the duration 245. Accordingly, deactivating the word line before completing the read operation (e.g., before the end of the duration 215) may mitigate differences in the charge integration durations of the memory cells, which may improve the overall performance and reliability of the associated memory device.

Figure 3A:
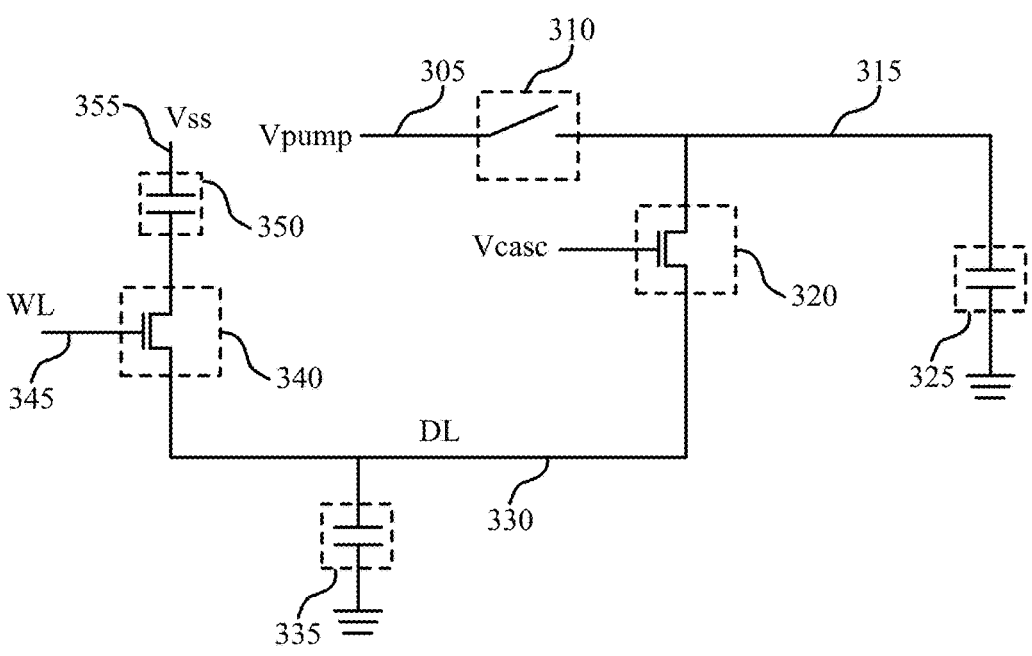
FIG. 3A illustrates an example of a circuit diagram that supports word line charge integration in accordance with examples as disclosed herein.

FIG. 3A illustrates an example of a circuit diagram 300-a that supports word line charge integration in accordance with examples as disclosed herein. In some examples, the circuit diagram 300-a may represent a sense circuit for a volatile memory device (e.g., a DRAM memory device). For example, the circuit diagram 300-a may depict a cascode 320 that is used to bias a digit line 330 to a voltage (e.g., to a fixed voltage) to integrate a charge to a capacitor 325 (e.g., an amp-cap 325). In some examples, the word line 345 may be deactivated before the end of a red operation (e.g., before the end of the duration 215 as described with reference to FIG. 2), which may mitigate differences in the charge integration durations of the memory cells, which may improve the overall performance and reliability of the associated memory device.

The circuit diagram 300-a may depict a voltage source 305 (e.g., a voltage pump 305, vpump 305) that is coupled with a switch 310. The switch 310 may be coupled with a line 315 (e.g., qvnet 315) that is coupled with a capacitor 325 (e.g., an amp-cap 325). The line 315 may be coupled with a cascode 320, that includes one or more transistors. The cascode 320 may be coupled with a digit line 330, and the digit line 330 may be coupled with a capacitor 335 and a transistor 340. In some examples, the transistor 340 may be coupled with a word line 345 and a capacitor 350 associated with a memory cell. In some instances, a plate of the capacitor 350 may be coupled with a voltage source 355 (e.g., VSS).

During an access operation, the word line 345 may be activated (e.g., driven to a voltage). Once the word line 345 reaches a threshold voltage level, the digit line 330 may be activated and the charge stored to the capacitor 350 may be integrated (e.g., provided to) the capacitor 325. As described herein, the word line 345 may be deactivated before the read operation is completed. Accordingly, differences in the charge integration durations of memory cells coupled with the word line 345 may be mitigated despite a starting voltage of qvnet 315 being higher or lower than a voltage corresponding to a logic state of a memory cell.

Figure 3B:
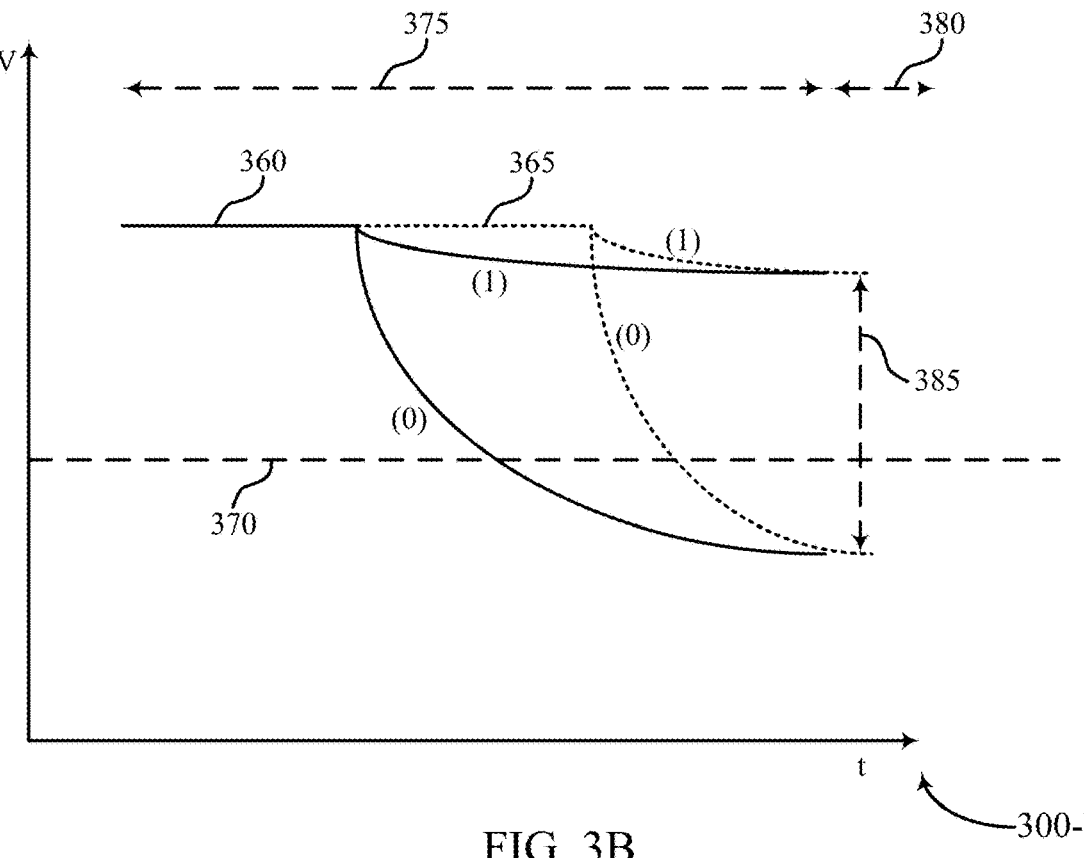
FIG. 3B illustrates an example of a timing diagram that supports word line charge integration in accordance with examples as disclosed herein.

FIG. 3B illustrates an example of a timing diagram 300-*b* that supports word line charge integration in accordance with examples as disclosed herein. The timing diagram 300-*b* may illustrate example voltages of the line 315 (e.g., qvnet 315) as described with reference to FIG. 3A. For example, the voltage 360 may represent a voltage of a first memory cell and the voltage 365 may represent a voltage of a second memory cell as described with reference to FIG. 2. Moreover, the voltage 360 and the voltage 365 may be depicted relative to a reference voltage 370. The voltage 360 and the voltage 365 may illustrate a word line being deactivated before the end of a read operation (e.g., before the end of the duration 375), which may mitigate differences in the charge integration durations of the memory cells and may improve the overall performance and reliability of the associated memory device.

As described herein, a read operation may occur during the duration 375. During the duration 375, a word line coupled with at least a first memory cell (e.g., a near memory cell) and a second memory cell (e.g., a far memory cell) may be deactivated to mitigate differences in the charge integration durations of the memory cells. For example, a charge stored to a first memory cell may be integrated to the capacitor 325 as described with reference to FIG. 3A via the line 315. If the capacitor (e.g., the capacitor 350) of the first memory cell stored a value associated with a first logic state (e.g., a logic "1"), then the voltage 360 of the line 315 may remain above the reference voltage 370, whereas if the capacitor of the first memory cell stored a value associated with a second logic state (e.g., a logic "0"), then the voltage 360 of the line 315 may fall below the reference voltage 370. It may be desirable for the difference 385 between the respective voltage values to be relatively large to improve the reliability of a sensing operation.

Additionally or alternatively, a charge stored to a second memory cell may be integrated to the capacitor 325 as described with reference to FIG. 3A via the line 315. Due to the proximity of the second memory cell to the first memory cell, the charge may begin to be integrated after the charge associated with the first memory cell begins to be integrated. If the capacitor (e.g., the capacitor 350) of the second memory cell stored a value associated with a first logic state (e.g., a logic "1"), then the voltage 365 of the line 315 may remain above the reference voltage 370, whereas if the capacitor of the first memory cell stored a value associated with a second logic state (e.g., a logic "0"), then the voltage 365 of the line 315 may fall below the reference voltage 370.

By deactivating the word line 345 before the end of the read operation (e.g., before the end of the duration 375), the difference 385 between the respective voltage values of the first memory cell may be the same or similar to those of the second memory cell. Having a similar difference 385 may improve the reliability of a subsequent sensing operation.

Accordingly, during a duration 380 respective sense amplifiers may be activated to sense the logic states associated with at least the first memory cell and the second memory cell. Deactivating the word line before completing the read operation (e.g., before the end of the duration 375) may mitigate differences in the charge integration durations of the memory cells, which may improve the overall performance and reliability of the associated memory device.

Figure 4:
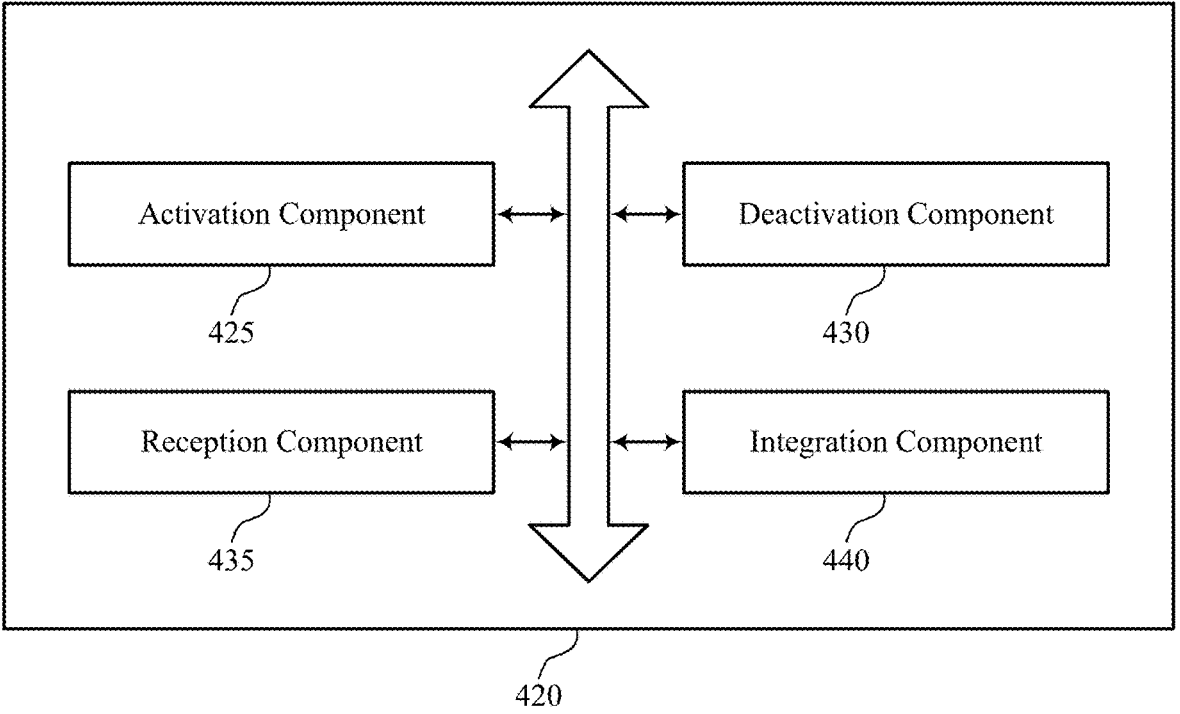
FIG. 4 illustrates a block diagram of a memory device that supports word line charge integration in accordance with examples as disclosed herein.

FIG. 4 illustrates a block diagram 400 of a memory device 420 that supports word line charge integration in accordance with examples as disclosed herein. The memory device 420 may be an example of aspects of a memory device as described with reference to FIGS. 1 through 3. The memory device 420, or various components thereof, may be an example of means for performing various aspects of word line charge integration as described herein. For example, the memory device 420 may include an activation component 425, a deactivation component 430, a reception component 435, an integration component 440, or any combination thereof. Each of these components may communicate, directly or indirectly, with one another (e.g., via one or more buses).

The activation component 425 may be configured as or otherwise support a means for activating a word line coupled with a plurality of memory cells. The deactivation component 430 may be configured as or otherwise support a means for deactivating the word line before activating sense components to sense a charge associated with a first subset of the plurality of memory cells and a second subset of the plurality of memory cells. In some examples, the activation component 425 may be configured as or otherwise support a means for activating the sense components to sense the charge associated with the first subset of the plurality of memory cells and the second subset of the plurality of memory cells based at least in part on deactivating the word line.

In some examples, the reception component 435 may be configured as or otherwise support a means for receiving a read command, where activating the word line is based at least in part on receiving the read command, and where the read command is completed based at least in part on activating the sense components to sense the charge associated with the plurality of memory cells.

In some examples, deactivating the word line occurs before the read command is completed.

In some examples, a first charge of a first memory cell of the first subset of the plurality of memory cells is integrated for a first duration. In some examples, a second charge of a second memory cell of the second subset of the plurality of memory cells is integrated for the first duration based at least in part on deactivating the word line before activating the sense components.

In some examples, a third memory cell included in the first subset of the plurality of memory cells is integrated for the first duration based at least in part on deactivating the word line before activating the sense components.

In some examples, activating the word line occurs at a first time and deactivating the word line occurs at a second time after the first time.

In some examples, a duration between the first time and the second time is based at least in part on a type of memory cell of the plurality of memory cells.

In some examples, the plurality of memory cells each include a volatile memory cell.

In some examples, the plurality of memory cells each include a non-volatile memory cell.

FIG. 5 illustrates a flowchart showing a method 500 that supports word line charge integration in accordance with examples as disclosed herein. The operations of method 500 may be implemented by a memory device or its components as described herein. For example, the operations of method 500 may be performed by a memory device as described with reference to FIGS. 1 through 4. In some examples, a memory device may execute a set of instructions to control the functional elements of the device to perform the described functions. Additionally, or alternatively, the memory device may perform aspects of the described functions using special-purpose hardware.

At 505, the method may include activating a word line coupled with a plurality of memory cells. The operations of 505 may be performed in accordance with examples as disclosed herein. In some examples, aspects of the operations of 505 may be performed by an activation component 425 as described with reference to FIG. 4.

At 510, the method may include deactivating the word line before activating sense components to sense a charge associated with a first subset of the plurality of memory cells and a second subset of the plurality of memory cells. The operations of 510 may be performed in accordance with examples as disclosed herein. In some examples, aspects of the operations of 510 may be performed by a deactivation component 430 as described with reference to FIG. 4.

At 515, the method may include activating the sense components to sense the charge associated with the first subset of the plurality of memory cells and the second subset of the plurality of memory cells based at least in part on deactivating the word line. The operations of 515 may be performed in accordance with examples as disclosed herein. In some examples, aspects of the operations of 515 may be performed by an activation component 425 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for activating a word line coupled with a plurality of memory cells: deactivating the word line before activating sense components to sense a charge associated with a first subset of the plurality of memory cells and a second subset of the plurality of memory cells: and activating the sense components to sense the charge associated with the first subset of the plurality of memory cells and the second subset of the plurality of memory cells based at least in part on deactivating the word line.

Aspect 2: The method, apparatus, or non-transitory computer-readable medium of aspect 1, further including operations, features, circuitry, logic, means, or instructions, or any combination thereof for receiving a read command, where activating the word line is based at least in part on receiving the read command, and where the read command is completed based at least in part on activating the sense components to sense the charge associated with the plurality of memory cells.

Aspect 3: The method, apparatus, or non-transitory computer-readable medium of aspect 2, where deactivating the word line occurs before the read command is completed.

Aspect 4: The method, apparatus, or non-transitory computer-readable medium of any of aspects 1 through 3, where a first charge of a first memory cell of the first subset of the plurality of memory cells is integrated for a first duration and a second charge of a second memory cell of the second subset of the plurality of memory cells is integrated for the first duration based at least in part on deactivating the word line before activating the sense components.

Aspect 5: The method, apparatus, or non-transitory computer-readable medium of aspect 4, where a third memory cell included in the first subset of the plurality of memory cells is integrated for the first duration based at least in part on deactivating the word line before activating the sense components.

Aspect 6: The method, apparatus, or non-transitory computer-readable medium of any of aspects 1 through 5, where activating the word line occurs at a first time and deactivating the word line occurs at a second time after the first time.

Aspect 7: The method, apparatus, or non-transitory computer-readable medium of aspect 6, where a duration between the first time and the second time is based at least in part on a type of memory cell of the plurality of memory cells.

Aspect 8: The method, apparatus, or non-transitory computer-readable medium of any of aspects 1 through 7, where the plurality of memory cells each include a volatile memory cell.

Aspect 9: The method, apparatus, or non-transitory computer-readable medium of any of aspects 1 through 8, where the plurality of memory cells each include a non-volatile memory cell.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow:

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
activating a word line coupled with a plurality of memory cells;
deactivating the word line before activating sense components to sense a charge associated with a first subset of the plurality of memory cells and a second subset of the plurality of memory cells; and
activating the sense components to sense the charge associated with the first subset of the plurality of memory cells and the second subset of the plurality of memory cells based at least in part on deactivating the word line.

2. The method of claim 1, further comprising:
receiving a read command, wherein activating the word line is based at least in part on receiving the read command, and wherein the read command is completed based at least in part on activating the sense components to sense the charge associated with the plurality of memory cells.

3. The method of claim 2, wherein deactivating the word line occurs before the read command is completed.

4. The method of claim 1, wherein:
a first charge of a first memory cell of the first subset of the plurality of memory cells is integrated for a first duration; and
a second charge of a second memory cell of the second subset of the plurality of memory cells is integrated for the first duration based at least in part on deactivating the word line before activating the sense components.

5. The method of claim 4, wherein a third memory cell included in the first subset of the plurality of memory cells is integrated for the first duration based at least in part on deactivating the word line before activating the sense components.

6. The method of claim 1, wherein activating the word line occurs at a first time and deactivating the word line occurs at a second time after the first time.

7. The method of claim 6, wherein a duration between the first time and the second time is based at least in part on a type of memory cell of the plurality of memory cells.

8. The method of claim 1, wherein the plurality of memory cells each comprise a volatile memory cell.

9. The method of claim 1, wherein the plurality of memory cells each comprise a non-volatile memory cell.

10. An apparatus, comprising: a controller associated with a memory device, wherein the controller is configured to cause the apparatus to:
activate a word line coupled with a plurality of memory cells;
deactivate the word line before activating sense components to sense a charge associated with a first subset of the plurality of memory cells and a second subset of the plurality of memory cells; and
activate the sense components to sense the charge associated with the first subset of the plurality of memory cells and the second subset of the plurality of memory cells based at least in part on deactivating the word line.

11. The apparatus of claim 10, wherein the controller is further configured to cause the apparatus to:
receive a read command, wherein activating the word line is based at least in part on receiving the read command, and wherein the read command is completed based at least in part on activating the sense components to sense the charge associated with the plurality of memory cells.

12. The apparatus of claim 11, wherein deactivating the word line occurs before the read command is completed.

13. The apparatus of claim 10, wherein:
a first charge of a first memory cell of the first subset of the plurality of memory cells is integrated for a first duration; and
a second charge of a second memory cell of the second subset of the plurality of memory cells is integrated for the first duration based at least in part on deactivating the word line before activating the sense components.

14. The apparatus of claim 13, wherein a third memory cell included in the first subset of the plurality of memory cells is integrated for the first duration based at least in part on deactivating the word line before activating the sense components.

15. The apparatus of claim 10, wherein activating the word line occurs at a first time and deactivating the word line occurs at a second time after the first time.

16. The apparatus of claim 15, wherein a duration between the first time and the second time is based at least in part on a type of memory cell of the plurality of memory cells.

17. The apparatus of claim 10, wherein the plurality of memory cells each comprise a volatile memory cell.

18. The apparatus of claim 10, wherein the plurality of memory cells each comprise a non-volatile memory cell.

19. A non-transitory computer-readable medium storing code, the code comprising instructions executable by a processor to:
activate a word line coupled with a plurality of memory cells;
deactivate the word line before activating sense components to sense a charge associated with a first subset of the plurality of memory cells and a second subset of the plurality of memory cells; and
activate the sense components to sense the charge associated with the first subset of the plurality of memory cells and the second subset of the plurality of memory cells based at least in part on deactivating the word line.

20. The non-transitory computer-readable medium of claim 19, wherein the instructions are further executable by the processor to:

receive a read command, wherein activating the word line is based at least in part on receiving the read command, and wherein the read command is completed based at least in part on activating the sense components to sense the charge associated with the plurality of memory cells.

* * * * *